US012422134B2

(12) United States Patent
He

(10) Patent No.: US 12,422,134 B2
(45) Date of Patent: Sep. 23, 2025

(54) POINT-CONTROL LAMP AND LAMP STRING

(71) Applicant: SHANGYOU JIAYI LIGHTING PRODUCT CO., LTD., Ganzhou (CN)

(72) Inventor: Yaowen He, Ganzhou (CN)

(73) Assignee: SHANGYOU JIAYI LIGHTING PRODUCT CO., LTD., Ganzhou (CN)

( * ) Notice: Subject to any disclaimer, the term of this patent is extended or adjusted under 35 U.S.C. 154(b) by 0 days.

(21) Appl. No.: 19/072,142

(22) Filed: Mar. 6, 2025

(65) Prior Publication Data

US 2025/0198608 A1    Jun. 19, 2025

Related U.S. Application Data

(63) Continuation of application No. 18/921,636, filed on Oct. 21, 2024, now abandoned, which is a
(Continued)

(30) Foreign Application Priority Data

Jul. 5, 2023    (CN) .......................... 202321754508.1

(51) Int. Cl.
*F21V 23/00* (2015.01)
*F21S 4/00* (2016.01)
(Continued)

(52) U.S. Cl.
CPC .............. *F21V 23/009* (2013.01); *F21S 4/00* (2013.01); *F21V 15/01* (2013.01);
(Continued)

(58) Field of Classification Search
CPC .... F21V 23/009; F21V 15/01; F21V 19/0035; F21V 23/06; F21S 4/00
See application file for complete search history.

(56) References Cited

U.S. PATENT DOCUMENTS 11,817,539 B1    11/2023    He
11,994,261 B1 *  5/2024    Lai .......................... H05B 45/20
(Continued)

FOREIGN PATENT DOCUMENTS

CN        202352673 U    7/2012
CN        203038639 U    7/2013
(Continued)

OTHER PUBLICATIONS

International Search Report from parent PCT/CN2024/103641. 5 Pages.
Written Opinion from parent PCT/CN2024/103641. 6 Pages.

*Primary Examiner* — Christopher E Dunay
(74) *Attorney, Agent, or Firm* — FisherBroyles, LLP; Craig W. Mueller

(57) ABSTRACT

The present disclosure provides a point-control lamp and a lamp string, wherein the point-control lamp includes a lighting component, a direct-insert LED support, and an injection-molded part. The direct-insert LED support includes a signal input part, a positive power connection part, and a negative power connection part. The lighting component includes a main control chip and multiple lighting chips. The lighting component is arranged inside the injection-molded part, and the direct-insert LED support passes through the injection-molded part and connects to the lighting component. The main control chip is electrically connected to the signal input part. The main control chip is also electrically connected to the positive power connection part, and the main control chip is also electrically connected to the negative power connection part. The lighting chips are electrically connected to the main control chip. The main control chip is configured to store a number address of the point-control lamp. Arranging a separate signal transmission line and matching with packaging addresses the issue of signal stability being affected by the power supply when the
(Continued)

signal is transmitted through traditional power lines, thereby increasing the maximum number of lamps that can maintain stable signals, reducing costs, and improving user experience.

10 Claims, 7 Drawing Sheets

Related U.S. Application Data continuation-in-part of application No. PCT/CN2024/103641, filed on Jul. 4, 2024.

(51) Int. Cl.
*F21V 15/01* (2006.01)
*F21V 19/00* (2006.01)
*F21V 23/06* (2006.01)
*F21Y 103/10* (2016.01)
*F21Y 113/13* (2016.01)
*F21Y 115/10* (2016.01)

(52) U.S. Cl.
CPC .......... *F21V 19/0035* (2013.01); *F21V 23/06* (2013.01); *F21Y 2103/10* (2016.08); *F21Y 2113/13* (2016.08); *F21Y 2115/10* (2016.08)

(56) References Cited

U.S. PATENT DOCUMENTS

| | | |
|---|---|---|
| 2009/0294782 A1 | 12/2009 | Peng |
| 2015/0201475 A1 | 7/2015 | Yin |
| 2024/0090101 A1* | 3/2024 | Yan ........................ H05B 45/30 |
| 2024/0215126 A1* | 6/2024 | Miskin .................. H05B 45/10 |
| 2024/0244725 A1* | 7/2024 | Yan ........................ H05B 45/50 |

FOREIGN PATENT DOCUMENTS

| | | | | |
|---|---|---|---|---|
| CN | 203859896 U | 10/2014 | | |
| CN | 204084174 U | 1/2015 | | |
| CN | 211289656 U | 8/2020 | | |
| CN | 217382611 U | 9/2022 | | |
| CN | 220439652 U | 2/2024 | | |
| CN | 220551866 U | 3/2024 | | |
| CN | 109152140 B | * | 8/2024 | ................ F21S 4/10 |

* cited by examiner

POINT-CONTROL LAMP AND LAMP STRING

CROSS-REFERENCE TO RELATED APPLICATION

This application is a continuation of U.S. patent application Ser. No. 18/921,636, filed Oct. 21, 2024, which is a continuation-in-part of PCT Application No. PCT/CN2024/103641, filed with the World Intellectual Property Office on Jul. 4, 2024, which designates the United States, and which claims priority to Chinese Patent Application Serial No. 2023217545081, filed with the Chinese Patent Office on Jul. 5, 2023, and entitled "POINT-CONTROL LAMP AND LAMP STRING," the entireties of which are incorporated by reference herein.

TECHNICAL FIELD

The present disclosure relates to the technical field of LED lamps, in particular to a point-control lamp and a lamp string.

BACKGROUND ART

The existing color-changing point-control lamps are mainly based on LED patch lamp beads, and the traditional direct-insert LED lamps are 2-wire carrier point-control, which transmits signals through power lines.

However, since the signal is transmitted through the power line, the stability of the signal transmission by the power line is affected by the power supply, resulting in a smaller maximum number of lamps that can maintain a stable signal, thus unable to make more lamps stable.

Optionally, for high-voltage color-changing point-control lamps, they are mainly based on lamp strips with external control ICs, which are more costly.

SUMMARY

In view of this, the objective of the present disclosure is to provide a point-control lamp and a lamp string, which, by arranging a separate signal transmission line and matching with packaging, addresses the issue of signal stability being affected by the power supply when the signal is transmitted through traditional power lines, thereby increasing the maximum number of lamps that can maintain stable signals, reducing costs, and improving user experience.

In a first aspect, the present disclosure provides a point-control lamp, wherein the point-control lamp includes a lighting component, a direct-insert LED support, and an injection-molded part. The direct-insert LED support includes a signal input part, a positive power connection part, and a negative power connection part. The lighting component includes a main control chip and multiple lighting chips. The lighting component is arranged inside the injection-molded part, and the direct-insert LED support passes through the injection-molded part and connects to the lighting component. The main control chip is electrically connected to the signal input part. The main control chip is also electrically connected to the positive power connection part, and the main control chip is also electrically connected to the negative power connection part. The lighting chips are electrically connected to the main control chip. The main control chip is configured to store a number address of the point-control lamp.

In some optional embodiments of the present disclosure, the direct-insert LED support also includes a signal output part, wherein the main control chip is electrically connected to the signal output part.

In some optional embodiments of the present disclosure, the lighting chip includes a blue lighting chip, a green lighting chip, and a red lighting chip. A power voltage between the positive power connection part and the negative power connection part is a first voltage. A positive pin of the blue lighting chip is electrically connected to the positive power connection part, and a negative pin of the blue lighting chip is electrically connected to a first pin of the main control chip. A positive pin of the green lighting chip is electrically connected to the positive power connection part, and a negative pin of the green lighting chip is electrically connected to a second pin of the main control chip. A positive pin of the red lighting chip is electrically connected to the positive power connection part, and a negative pin of the red lighting chip is electrically connected to a third pin of the main control chip.

In some optional embodiments of the present disclosure, the lighting chip also includes a white lighting chip. A positive pin of the white lighting chip is electrically connected to the positive power connection part, and a negative pin of the white lighting chip is electrically connected to a fourth pin of the main control chip.

In some optional embodiments of the present disclosure, the lighting chip includes a blue lighting chip, a green lighting chip, and a red lighting chip. A power voltage between the positive power connection part and the negative power connection part is a second voltage. The positive pin of the red lighting chip is electrically connected to the positive power connection part. The negative pin of the red lighting chip, a fifth pin of the main control chip, a sixth pin of the main control chip, and the positive pin of the green lighting chip are sequentially electrically connected. The negative pin of the green lighting chip, a seventh pin of the main control chip, an eighth pin of the main control chip, and the positive pin of the blue lighting chip are sequentially electrically connected. The negative pin of the blue lighting chip is electrically connected to a ninth pin of the main control chip.

In some optional embodiments of the present disclosure, the lighting chip also includes a white lighting chip. The negative pin of the blue lighting chip, the ninth pin of the main control chip, a tenth pin of the main control chip, and the positive pin of the white lighting chip are sequentially electrically connected. The negative pin of the white lighting chip is electrically connected to an eleventh pin of the main control chip.

In some optional embodiments of the present disclosure, the lighting chip includes a blue lighting chip, a green lighting chip, and a red lighting chip. A power voltage between the positive power connection part and the negative power connection part is a third voltage. The positive pin of the red lighting chip is electrically connected to the positive power connection part. The negative pin of the red lighting chip, a fifth pin of the main control chip, a sixth pin of the main control chip, and the positive pin of the green lighting chip are sequentially electrically connected. The negative pin of the green lighting chip, a seventh pin of the main control chip, an eighth pin of the main control chip, and the positive pin of the blue lighting chip are sequentially electrically connected. The negative pin of the blue lighting chip is electrically connected to a ninth pin of the main control chip.

In some optional embodiments of the present disclosure, the lighting chips include multiple blue lighting chips, multiple green lighting chips, and multiple red lighting chips. Multiple blue lighting chips are sequentially connected to form a blue lighting component. Multiple green lighting chips are sequentially connected to form a green lighting component. Multiple red lighting chips are sequentially connected to form a red lighting component. A power voltage between the positive power connection part and the negative power connection part is a third voltage. A positive pin of the red lighting component is electrically connected to the positive power connection part. A negative pin of the red lighting component, the fifth pin of the main control chip, the sixth pin of the main control chip, and a positive pin of the green lighting component are sequentially electrically connected. The negative pin of the green lighting component, the seventh pin of the main control chip, the eighth pin of the main control chip, and a positive pin of the blue lighting component are sequentially electrically connected. The negative pin of the blue lighting component is electrically connected to the ninth pin of the main control chip.

In some optional embodiments of the present disclosure, the lighting chip also includes a white lighting chip. The negative pin of the blue lighting chip, the ninth pin of the main control chip, a tenth pin of the main control chip, and the positive pin of the white lighting chip are sequentially electrically connected. The negative pin of the white lighting chip is electrically connected to the eleventh pin of the main control chip.

In a second aspect, the present disclosure provides a lamp string, wherein the lamp string includes a power supply and the point-control lamp of any of the above items.

The present disclosure has the following beneficial effects.

The present disclosure provides a point-control lamp and a lamp string, wherein the point-control lamp includes a lighting component, a direct-insert LED support, and an injection-molded part. The direct-insert LED support includes a signal input part, a positive power connection part, and a negative power connection part. The lighting component includes a main control chip and multiple lighting chips. The lighting component is arranged inside the injection-molded part, and the direct-insert LED support passes through the injection-molded part and connects to the lighting component. The main control chip is electrically connected to the signal input part. The main control chip is also electrically connected to the positive power connection part, and the main control chip is also electrically connected to the negative power connection part. The lighting chips are electrically connected to the main control chip. The main control chip is configured to store a number address of the point-control lamp. Arranging a separate signal transmission line and matching with packaging solves the issue of signal stability being affected by the power supply when the signal is transmitted through traditional power lines, thereby increasing the maximum number of lamps that can maintain stable signals, reducing costs, and improving user experience.

BRIEF DESCRIPTION OF DRAWINGS

In order to more clearly illustrate the specific embodiments of the present disclosure or the technical solution in the prior art, the drawings required to be used in the description of the specific embodiment or the prior art will be briefly introduced as follows. Obviously, the drawings described below are some embodiments of the present disclosure. Those of ordinary skill in the art, without paying inventive labor, may also obtain other drawings according to these drawings.

REFERENCE NUMERALS

Figure 1:
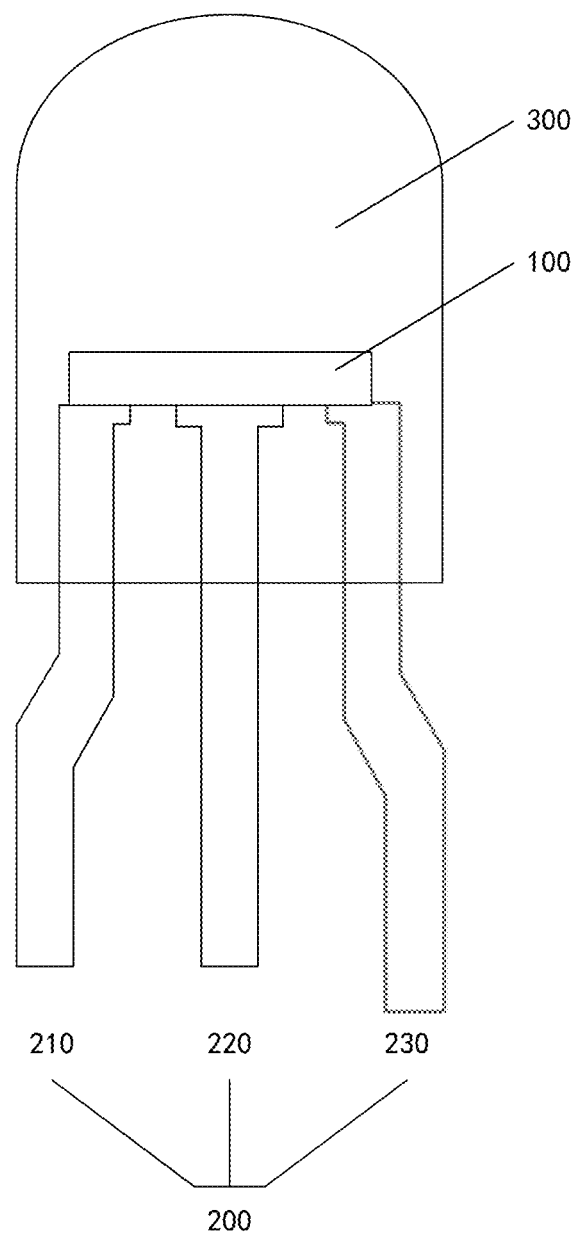
FIG. 1 is a front view of a structure of a point-control lamp provided in the embodiment of the present disclosure.

100—lighting component; 110—main control chip; 112—first pin of the main control chip; 114—second pin of the main control chip; 116—third pin of the main control chip; 118—fourth pin of the main control chip; 132—fifth pin of the main control chip; 134—sixth pin of the main control chip; 136—seventh pin of the main control chip; 138—eighth pin of the main control chip; 140—ninth pin of the main control chip; 142—tenth pin of the main control chip; 144—eleventh pin of the main control chip; 120—lighting chip; 122—blue lighting chip; 124—green lighting chip; 126—red lighting chip; 128—white lighting chip; 200—direct-insert LED support; 210—signal input part; 220—negative power connection part; 230—positive power connection part; 240—signal output part; 300—injection-molded part; 1000—point-control lamp; 2000—power supply.

DETAILED DESCRIPTION OF EMBODIMENTS

In order to make the objectives, technical solutions, and advantages of the embodiments of the present disclosure clearer, the technical solutions in the embodiments of the present disclosure will be clearly and completely described below in conjunction with the drawings in the embodiments of the present disclosure. It is evident that the described embodiments are part of the embodiments of the present disclosure, but not all of the embodiments. The components of the embodiments of the present disclosure described and illustrated in the drawings can typically be arranged and designed in various configurations.

Therefore, the following detailed description of the embodiments of the present disclosure provided in the drawings is not intended to limit the scope of the present disclosure for which protection is claimed, but merely represents selected embodiments of the present disclosure. Based on the embodiments of the present disclosure, all other embodiments obtained by those skilled in the art without inventive effort shall fall within the scope of protection of the present disclosure.

It should be noted that similar numerals and letters denote similar terms in the following drawings so that once an item is defined in one drawing, it does not need to be further discussed in subsequent drawings.

In the description of the present disclosure, it should be noted that the orientation or positional relationship indicated by the terms, "center", "up", "down", "left", "right", "vertical", "horizontal", "inside", "outside", etc. is based on the orientation or positional relationship shown in the drawings or the orientation or positional relationship in which the product of the present disclosure is customarily placed when used. It is intended only to facilitate the description of the present disclosure and to simplify the description, and not to indicate or imply that the devices or elements referred to must have a particular orientation, be constructed and operated in a particular orientation. Accordingly, it is not to be construed as a limitation of the present disclosure. In addition, the terms "first", "second", and "third" are only used to distinguish the descriptive and are not to be construed as indicating or implying relative importance.

In addition, the terms, "horizontal", "vertical", and "overhang" do not mean that elements are required to be absolutely horizontal or overhanging, but can be slightly inclined. For example, "horizontal" only means that its direction is more horizontal than "vertical", and it does not mean that the structure must be completely horizontal, but can be slightly inclined.

In the description of the present disclosure, it should also be noted that unless otherwise clearly stipulated and limited, the terms "provide", "arrange", "connect", and "communicate" should be understood in a broad sense, for example, it can be a fixed connection, a detachable connection, or an integral connection; it can be a mechanical connection or an electrical connection; and it can be a direct connection, an indirect connection through an intermediary, or an internal communication between two components. Those of ordinary skill in the art can understand the meanings of the above terms in the present disclosure according to specific situations.

The existing 5V color-changing point-control lamps are mainly based on LED patch lamp beads, and the traditional direct-insert LED lamps are 2-wire carrier point-control, which transmits signals through power lines. However, since the signal is transmitted through the power line, the stability of the signal transmission by the power line is affected by the power supply, resulting in a smaller maximum number of lamps that can maintain a stable signal, thus unable to stably support more lamps. For 12V-24V color-changing point-control lamps, they are mainly based on multiple 5V color-changing point-control lamps strung together to form a lamp strip with an external control IC, which is more costly.

In view of this, the objective of the present disclosure is to provide a point-control lamp and a lamp string, which, by arranging a separate signal transmission line and matching with packaging, solves the issue of signal stability being affected by the power supply when the signal is transmitted through traditional power lines, thereby increasing the maximum number of lamps that can maintain stable signals, reducing costs, and improving user experience.

Some embodiments of the present disclosure are described in detail below, in conjunction with the drawings. The embodiments and features described herein can be combined with each other in a non-conflicting manner.

The present disclosure provides a point-control lamp. Referring to FIG. 1, FIG. 1 is a front view of the structure of the point-control lamp provided in the embodiment of the present disclosure. The point-control lamp 1000 includes a lighting component 100, a direct-insert LED support 200, and an injection-molded part 300. The direct-insert LED support 200 includes a signal input part 210, a positive power connection part 230, and a negative power connection part 220. The lighting component 100 is arranged inside the injection-molded part 300, and the direct-insert LED support 200 passes through the injection-molded part 300 and connects to the lighting component 100.

In some embodiments, the signal input part 210, the positive power connection part 230, and the negative power connection part 220 are all conductive metal parts. In the distribution method of the direct-insert LED support 200 shown in FIG. 1, the left metal part is the signal input part 210, the middle metal part is the positive power connection part 230, and the right metal part is the negative power connection part 220. In actual production, the direct-insert LED support 200 is not designed in only one way as shown in FIG. 1; the three metal parts can interchange positions, and only corresponding adjustments in the external matching parts are needed.

Optionally, the injection-molded part 300 shown in FIG. 1 is a round-headed cylinder. During actual production, certain adjustments can be made to the injection-molded part 300. For example, the injection-molded part 300 can be made into a cylindrical shape with a certain indentation at the top to achieve the objective of focusing light; the injection-molded part 300 can also be made in the shape of a straw hat to facilitate fixing on an attachment; and changes can be made according to production needs.

Figure 2:
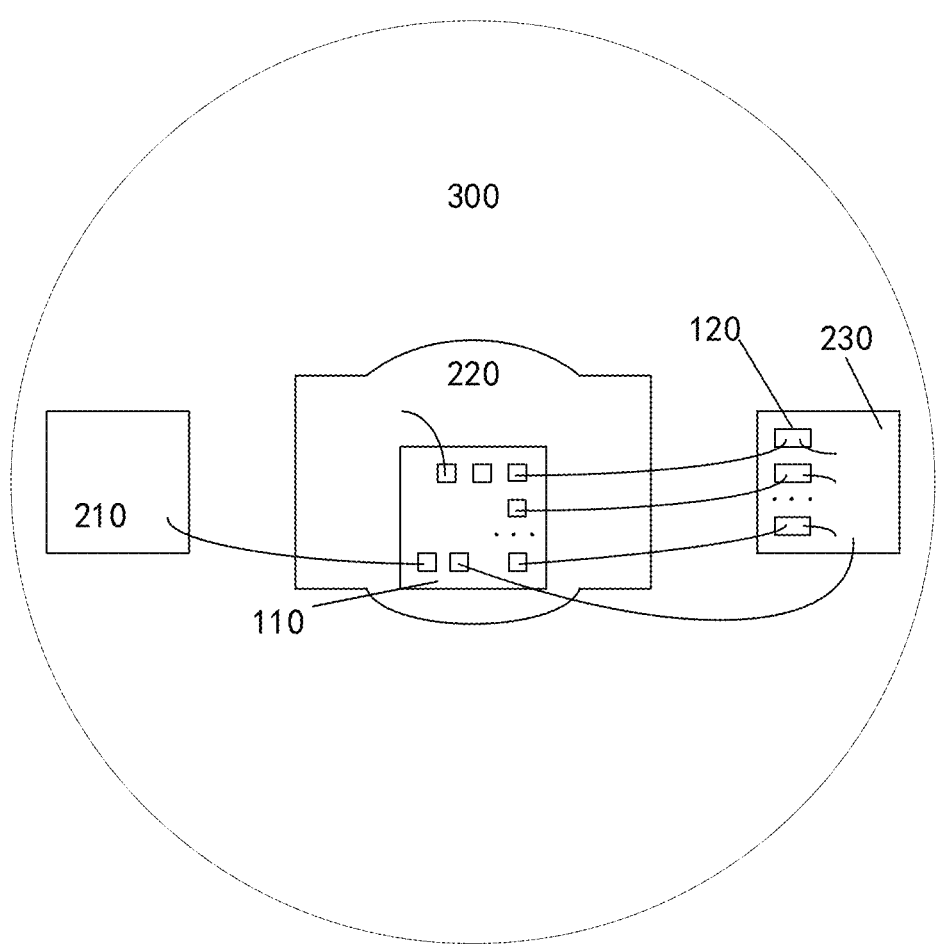
FIG. 2 is a top view of the structure of the point-control lamp provided in the embodiment of the present disclosure.

Optionally, referring to FIG. 2, which is a top view of the structure of the point-control lamp provided in the embodiment of the present disclosure, the lighting component 100 includes a main control chip 110 and multiple lighting chips 120. The main control chip 110 is electrically connected to the signal input part 210. The main control chip 110 is also electrically connected to the positive power connection part 230, and the main control chip 110 is also electrically connected to the negative power connection part 220. The lighting chips 120 are electrically connected to the main control chip 110. The main control chip 110 is configured to store the number address of the point-control lamp 1000.

In one possible embodiment, the arc lines in FIG. 2 can be metal wires configured to electrically connect two components. In FIG. 2, the main control chip 110 is arranged on the negative power connection part 220, and multiple lighting chips 120 are arranged on the positive power connection part 230. The main control chip 110 connects to the positive power connection part 230 and the negative power connection part 220 to obtain power from the power supply 2000 and connects to the signal input part 210 to obtain external signals. The multiple lighting chips 120 are different colored lighting chips 120, generally divided into RGB three colors. The lighting chips 120 can be positive polarity lighting chips 120, negative polarity lighting chips 120, or bipolar lighting chips 120, wherein each lighting chip 120 corresponds to different wiring methods. For example, if a negative polarity red lighting chip 126 is used, it can be directly connected to the positive power connection part 230 at the bottom with silver paste. Optionally, an external metal wire can also be connected to the positive power connection part 230 as a double insurance. If a positive polarity red lighting chip 126 is used, it needs to be arranged on the negative power connection part 220, for changing the polarity and connecting in the same way as the negative polarity red lighting chip 126. If it is a bipolar red lighting chip 126, it connects to the positive power connection part 230 through the positive pole of the lighting chip 120, and the positive pole of the lighting chip 120 connects to the main control chip 110.

Optionally, the main control chip 110 is configured to store the number address of the point-control lamp 1000. Burning in the number address after the product is completed can greatly reduce the address error rate of the product. After connecting multiple point-control lamps 1000 into a lamp string, a single signal transmission line is applied to connect all signal input parts 210 of the point-control lamps 1000. In the lamp string, the point-control lamps 1000 are in a signal-linked state, which, in the event that one signal lamp fails, does not affect the signal transmission and ensures the normal operation of the lamp string.

The present disclosure provides a point-control lamp, wherein the point-control lamp 1000 includes a lighting component 100, a direct-insert LED support 200, and an injection-molded part 300. The direct-insert LED support 200 includes a signal input part 210, a positive power connection part 230, and a negative power connection part 220. The lighting component 100 includes a main control chip 110 and multiple lighting chips 120. The lighting component 100 is arranged inside the injection-molded part 300, and the direct-insert LED support 200 passes through the injection-molded part 300 and connects to the lighting component 100. The main control chip 110 is electrically connected to the signal input part 210. The main control chip 110 is further electrically connected to the positive power connection part 230. The main control chip 110 is further electrically connected to the negative power connection part 220. The lighting chips 120 are electrically connected to the main control chip 110. The main control chip 110 is configured to store the number address of the point-control lamp 1000. Arranging a separate signal transmission line and matching with packaging solves the issue of signal stability being affected by the power supply when the signal is transmitted through traditional power lines, thereby increasing the maximum number of lamps that can maintain stable signals, reducing costs, and improving user experience.

Figure 3:
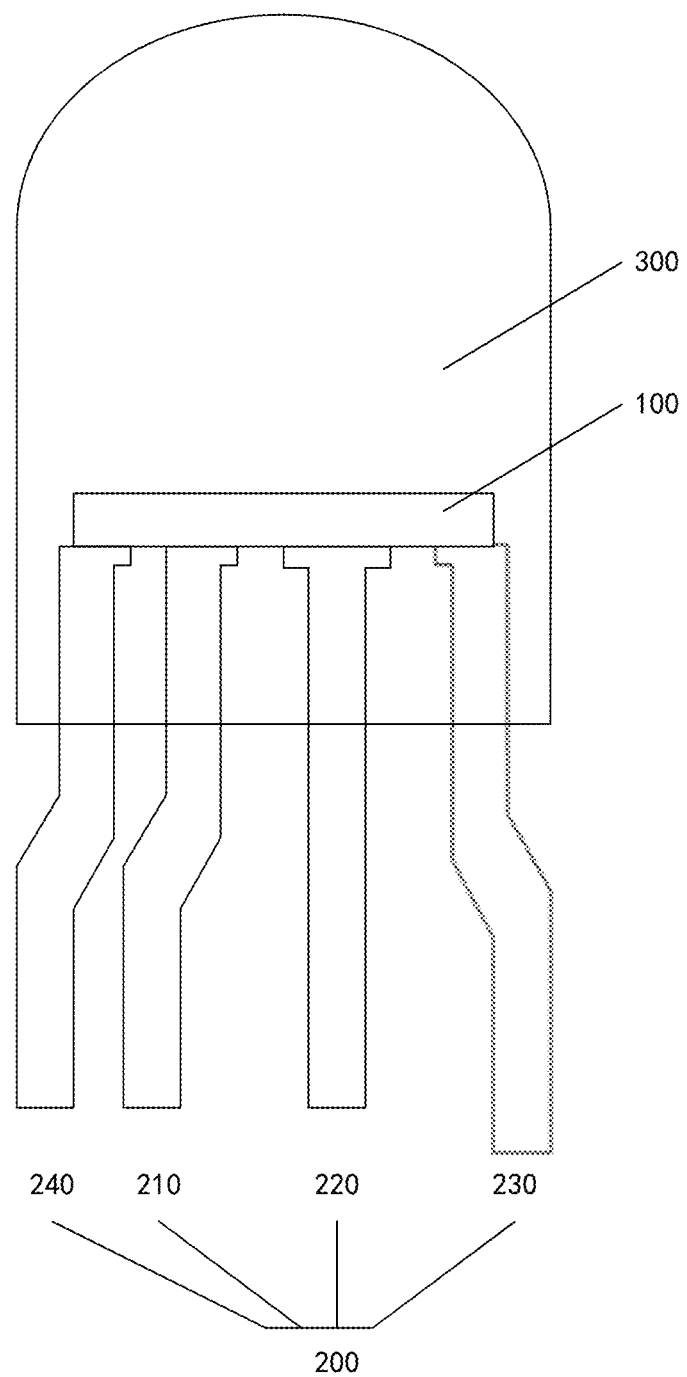
FIG. 3 is a front view of the structure of the point-control lamp provided in the embodiment of the present disclosure.
Figure 4:
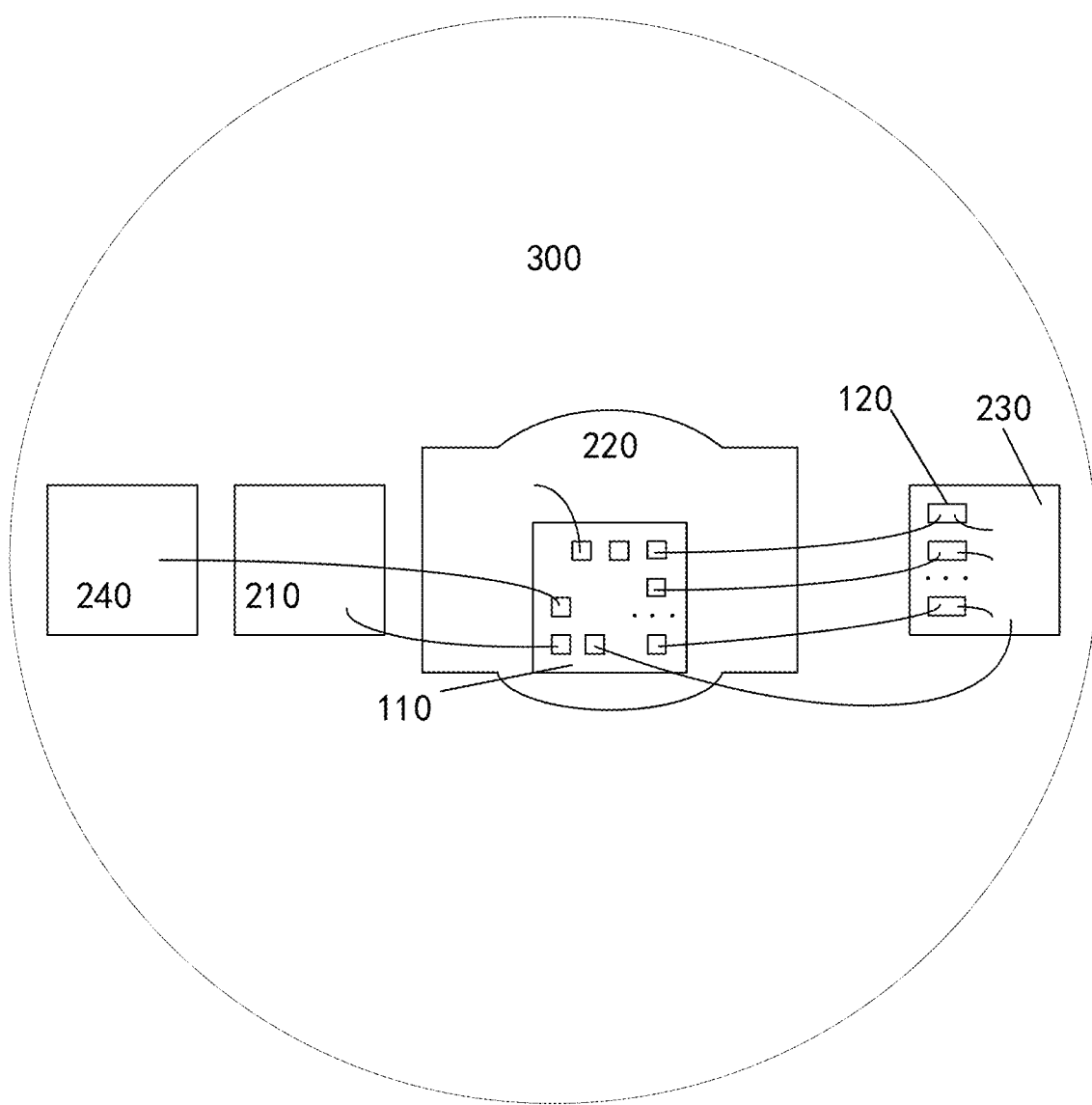
FIG. 4 is a top view of the structure of the point-control lamp provided in the embodiment of the present disclosure.

Based on the above embodiment, the present disclosure provides a second point-control lamp 1000. Referring to FIGS. 3 and 4, FIG. 3 is a front view of the structure of the point-control lamp provided in the embodiment of the present disclosure, and FIG. 4 is a top view of the structure of the point-control lamp provided in the embodiment of the present disclosure. The direct-insert LED support 200 also includes a signal output part 240. The main control chip 110 is electrically connected to the signal output part 240.

Figure 5:
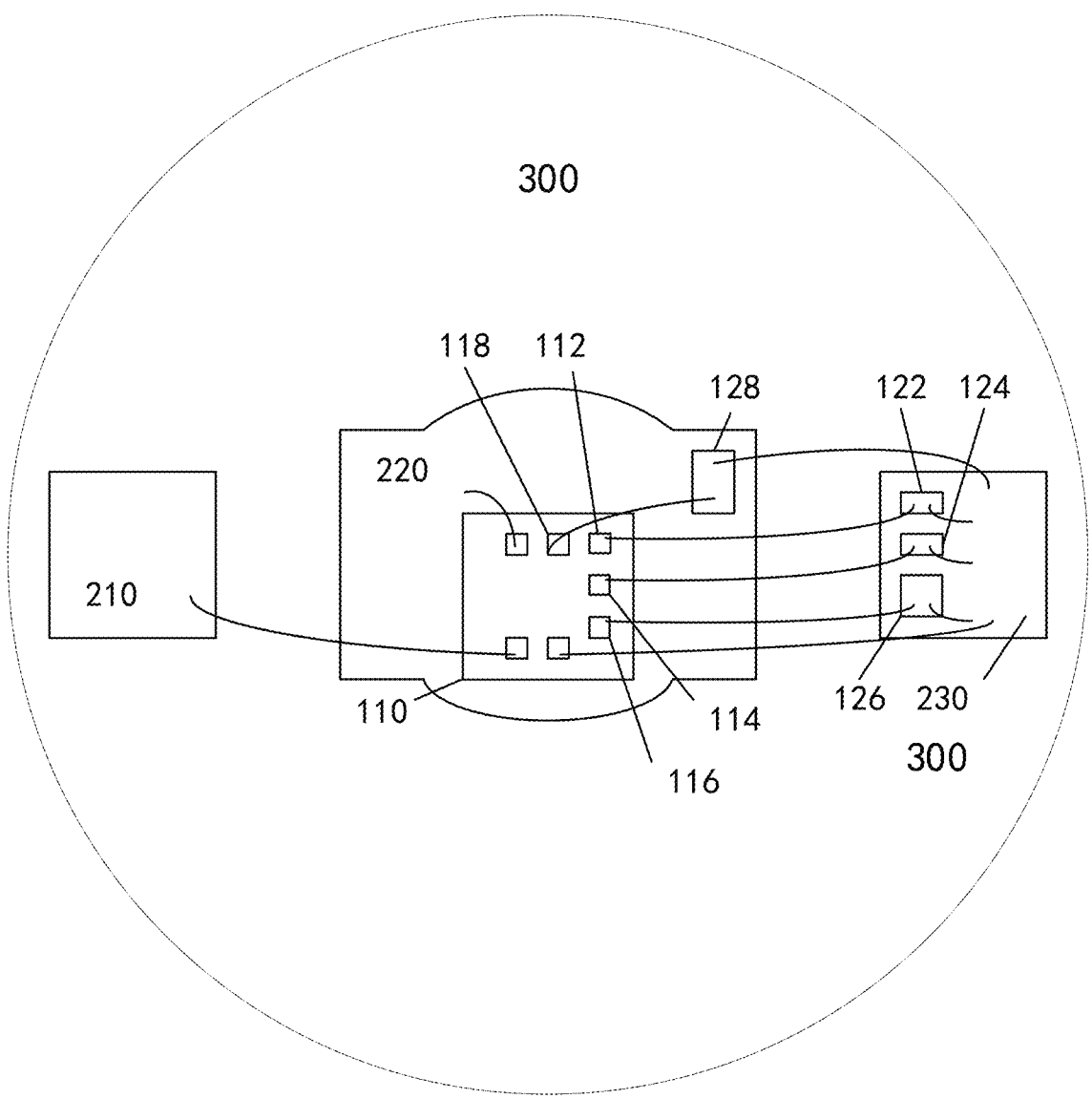
FIG. 5 is a top view of the structure of the point-control lamp provided in the present disclosure.

Optionally, referring to FIG. 5, FIG. 5 is a top view of the structure of the point-control lamp provided in the present disclosure. The lighting chip 120 includes a blue lighting chip 122, a green lighting chip 124, and a red lighting chip 126. The voltage of the power supply 2000 between the positive power connection part 230 and the negative power connection part 220 is the first voltage. The positive pin of the blue lighting chip 122 is electrically connected to the positive power connection part 230, and the negative pin of the blue lighting chip 122 is electrically connected to the first pin 112 of the main control chip. The positive pin of the green lighting chip 124 is electrically connected to the positive power connection part 230, and the negative pin of the green lighting chip 124 is electrically connected to the second pin 114 of the main control chip. The positive pin of the red lighting chip 126 is electrically connected to the positive power connection part 230, and the negative pin of the red lighting chip 126 is electrically connected to the third pin 116 of the main control chip.

Optionally, continuing to refer to FIG. 5, the lighting chip 120 also includes a white lighting chip 128. The positive pin of the white lighting chip 128 is electrically connected to the positive power connection part 230, and the negative pin of the white lighting chip 128 is electrically connected to the fourth pin 118 of the main control chip.

Optionally, the first voltage is 5V, and the red lighting chip 126 is a negative polarity red lighting chip 126. Most white lighting chips 128 are made by covering a blue LED (near-UV, wavelength 430 nm to 470 nm) with a layer of light-yellow fluorescent powder coating. The yellow phosphor is usually made by grinding cerium-doped yttrium aluminum garnet (Ce3+:YAG) crystals into a powder and mixing it in a dense AB adhesive. When the LED chip emits blue light, part of the blue light is efficiently converted by the crystal into a predominantly yellow light with a broader spectrum (spectral center of about 580 nm). In fact, single crystal Ce-doped YAG is regarded as a scintillator rather than a phosphor. Because the yellow light will stimulate the red light and green light receptors in the human eye, and be mixed with the blue light of the LED itself, it looks like white light, and its color is often referred to as "moonlight white".

Figure 6:
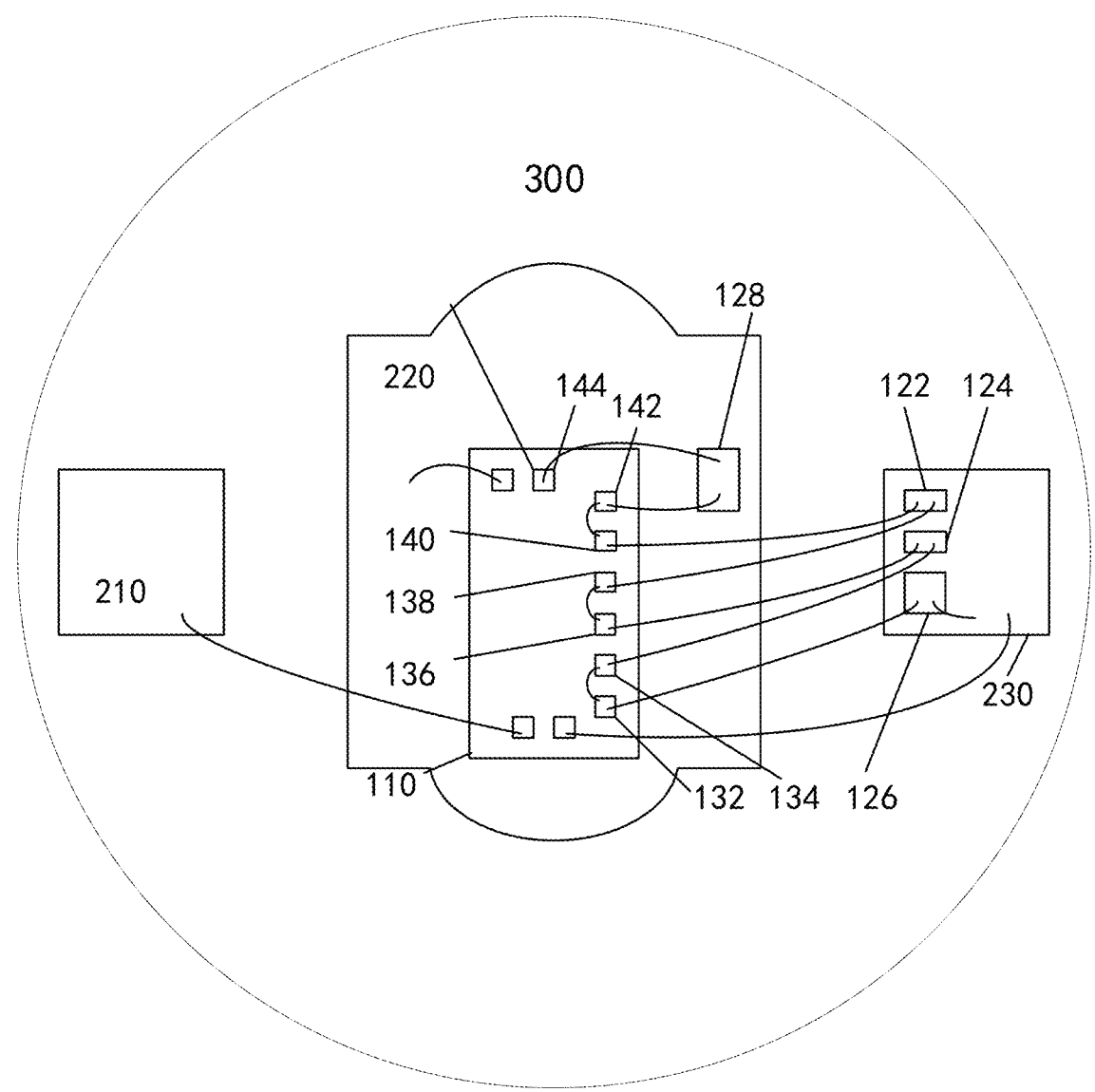
FIG. 6 is a top view of the structure of the point-control lamp provided in the present disclosure.

Optionally, referring to FIG. 6, FIG. 6 is a top view of the structure of a fourth point-control lamp provided in the present disclosure. The lighting chip 120 includes a blue lighting chip 122, a green lighting chip 124, and a red lighting chip 126. The voltage of the power supply 2000 between the positive power connection part 230 and the negative power connection part 220 is the second voltage, wherein the second voltage is 12V. The positive pin of the red lighting chip 126 is electrically connected to the positive power connection part 230. The negative pin of the red lighting chip 126, a fifth pin 132 of the main control chip, a sixth pin 134 of the main control chip, and the positive pin of the green lighting chip 124 are sequentially electrically connected. The negative pin of the green lighting chip 124, a seventh pin 136 of the main control chip, an eighth pin 138 of the main control chip, and the positive pin of the blue lighting chip 122 are sequentially electrically connected. The negative pin of the blue lighting chip 122 is electrically connected to a ninth pin 140 of the main control chip.

Optionally, continuing to refer to FIG. 6, the lighting chip 120 also includes a white lighting chip 128. The negative pin of the blue lighting chip 122, the ninth pin 140 of the main control chip, a tenth pin 142 of the main control chip, and the positive pin of the white lighting chip 128 are sequentially electrically connected. The negative pin of the white lighting chip 128 is electrically connected to the eleventh pin 144 of the main control chip.

Optionally, the lighting chip 120 includes a blue lighting chip 122, a green lighting chip 124, and a red lighting chip 126. The voltage of the power supply 2000 between the positive power connection part 230 and the negative power connection part 220 is the third voltage, wherein the third voltage is 24V. When each color is a single lighting chip 120, the structure of the point-control lamp 1000 is not different from the structure of the point-control lamp 1000 shown in FIG. 6. Therefore, referring to FIG. 6, the positive pin of the red lighting chip 126 is electrically connected to the positive power connection part 230. The negative pin of the red lighting chip 126, a fifth pin 132 of the main control chip, a sixth pin 134 of the main control chip, and the positive pin of the green lighting chip 124 are sequentially electrically connected. The negative pin of the green lighting chip 124, a seventh pin 136 of the main control chip, an eighth pin 138 of the main control chip, and the positive pin of the blue lighting chip 122 are sequentially electrically connected. The negative pin of the blue lighting chip 122 is electrically connected to a ninth pin 140 of the main control chip.

Optionally, the lighting chip 120 also includes a white lighting chip 128. The negative pin of the blue lighting chip 122, the ninth pin 140 of the main control chip, a tenth pin 142 of the main control chip, and the positive pin of the white lighting chip 128 are sequentially electrically connected. The negative pin of the white lighting chip 128 is electrically connected to the eleventh pin 144 of the main control chip.

Figure 7:
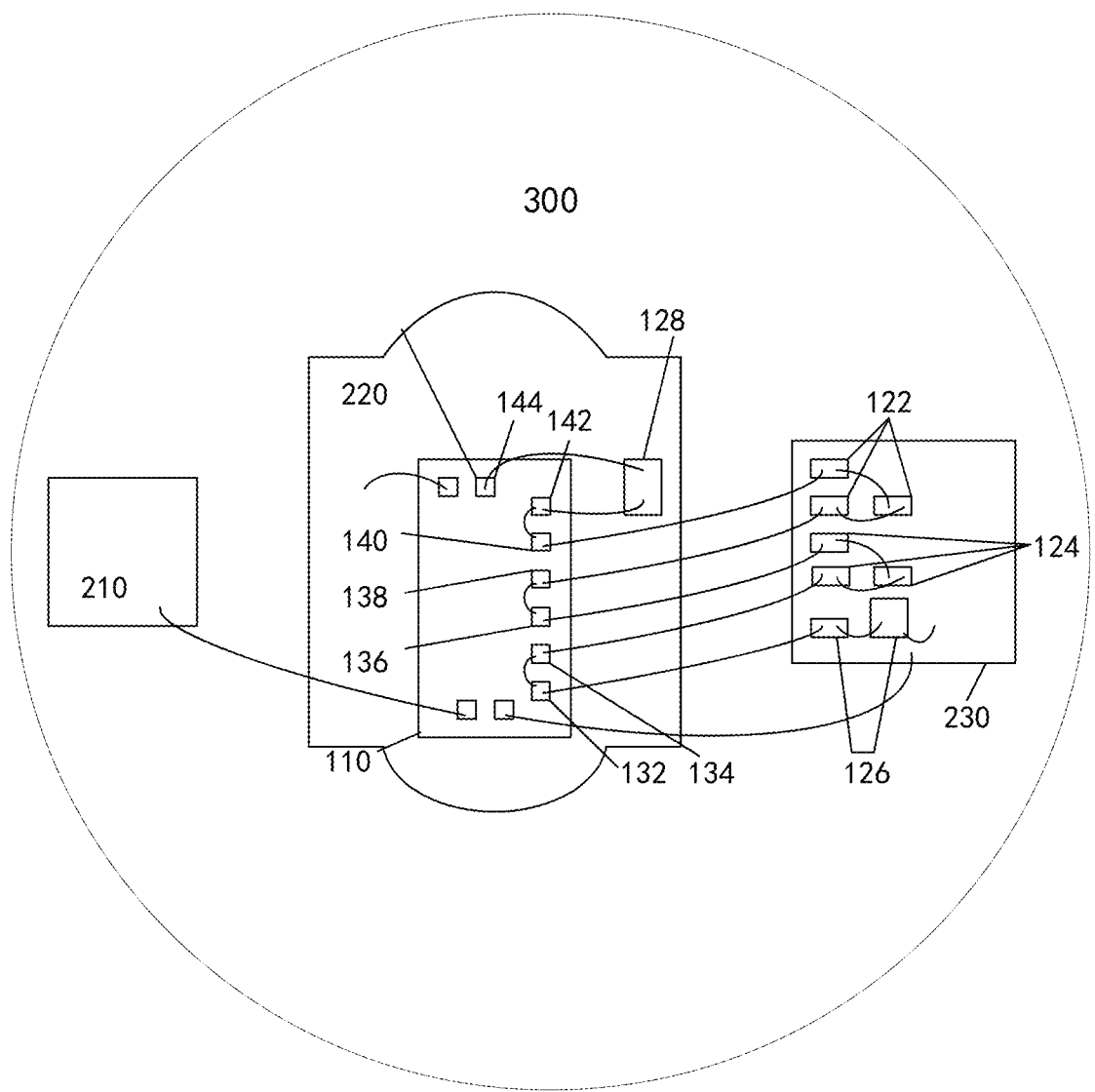
FIG. 7 is a top view of the structure of the point-control lamp provided in the present disclosure.

Optionally, the lighting chip 120 includes multiple blue lighting chips 122, multiple green lighting chips 124, and multiple red lighting chips 126. Multiple blue lighting chips 122 are sequentially connected to form a blue lighting component. Multiple green lighting chips 124 are sequentially connected to form a green lighting component. Multiple red lighting chips 126 are sequentially connected to form a red lighting component. The voltage of the power supply 2000 between the positive power connection part 230 and the negative power connection part 220 is the third voltage, wherein the third voltage is 24V. Referring to FIG. 7, FIG. 7 is a top view of the structure of the point-control lamp provided in the present disclosure. The blue and green lighting components are each composed of three lighting chips 120. The red lighting component is composed of a negative polarity lighting chip 120 and a bipolar lighting chip 120. A positive pin of the red lighting component is electrically connected to the positive power connection part 230. A negative pin of the red lighting component, the fifth pin 132 of the main control chip, the sixth pin 134 of the main control chip, and a positive pin of the green lighting component are sequentially electrically connected. The negative pin of the green lighting component, the seventh pin 136 of the main control chip, the eighth pin 138 of the main control chip, and a positive pin of the blue lighting component are sequentially electrically connected. The negative pin of the blue lighting component is electrically connected to the ninth pin 140 of the main control chip.

It should be noted that all the point-control lamps 1000 provided in the embodiment only provide one case in the position of the chip arrangement. In actual production, the chip positions can be adjusted according to the design between the direct-insert LEDs. The point-control lamps 1000, shown in FIGS. 5, 6, and 7, include only the input signal part. If it is necessary to arrange the output signal part, the signal output part can be connected to the corresponding pin on the main control chip 110. The first to eleventh pins of the main control chip in the embodiments do not represent the actual number of pins on the main control chip but are named for ease of description. The number of pins and their connections will be determined based on the specific main control chip used in production.

The point-control lamp provided in the embodiments of the present disclosure includes a separate signal line, which allows for farther and more stable signal transmission, and has more lamps than traditional two-wire carrier point-control lamps. Additionally, the address can be burned in after the final product is made, whether it is a 3-channel (RGB) or 4-channel (RGBW) point-control lamp operating at 5V, 12V, or 24V. Optionally, in a 12V and 24V environment, there is no need to rely on multiple point-control lamps 1000 connected in series, as they can be used directly.

Figure 8:
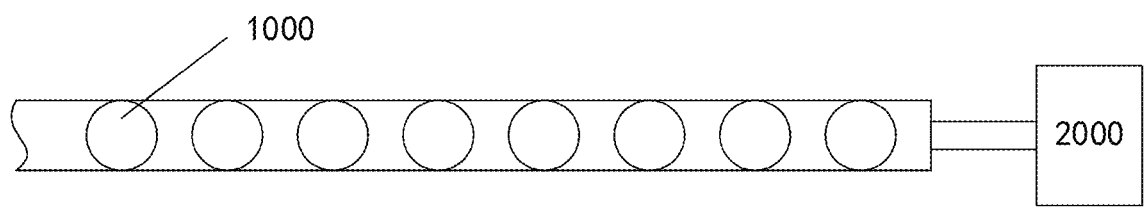
FIG. 8 is a schematic structural diagram of a lamp string provided in the embodiment of the present disclosure.

Based on the above embodiments, the embodiments of the present disclosure provide a lamp string, as shown in FIG. 8, which is a schematic structural diagram of a lamp string provided in the embodiment of the present disclosure. The lamp string includes a power supply 2000 and multiple point-control lamps 1000 of any one of the embodiments described above.

Those skilled in the art will clearly understand that for convenience and brevity, the specific structure of the lamp string described above can refer to the corresponding structure in the embodiments of the point-control lamp described previously and will not be elaborated here.

Finally, it should be noted that the above embodiments are intended only to illustrate the technical solutions of the present disclosure and are not intended to be a limitation thereof. Notwithstanding the detailed description of the present disclosure with reference to the foregoing embodiments, it should be understood by those of ordinary skill in the art that one may still modify the technical solution described in the preceding embodiments, or replace some or all of the technical features equally. These modifications or substitutions do not depart the essence of the corresponding technical solution from the scope of the technical solution of the embodiments of the present disclosure.

INDUSTRIAL PRACTICALITY

By adopting the above solutions, arranging a separate signal transmission line and matching with packaging addresses the issue of signal stability being affected by the power supply when the signal is transmitted through traditional power lines, thereby increasing the maximum number of lamps that can maintain stable signals, reducing costs, and improving user experience.

What is claimed is:

1. A point-control lamp, wherein the point-control lamp comprises a lighting component, a direct-insert LED support, and an injection-molded part; the direct-insert LED support comprises a signal input part, a positive power connection part, and a negative power connection part; the lighting component comprises a main control chip and multiple lighting chips; the lighting component is arranged inside the injection-molded part, and the direct-insert LED support passes through the injection-molded part and connects to the lighting component;

the main control chip is electrically connected to the signal input part;

the main control chip is further electrically connected to the positive power connection part, and the main control chip is further electrically connected to the negative power connection part;

the lighting chips are electrically connected to the main control chip; and the main control chip is configured to store a number address of the point-control lamp.

2. The point-control lamp according to claim 1, wherein the direct-insert LED support further comprises a signal output part, and the main control chip is electrically connected to the signal output part.

3. The point-control lamp according to claim 1, wherein the lighting chips comprise a blue lighting chip, a green lighting chip, and a red lighting chip; a power voltage between the positive power connection part and the negative power connection part is a first voltage;

a positive pin of the blue lighting chip is electrically connected to the positive power connection part, and a negative pin of the blue lighting chip is electrically connected to a first pin of the main control chip;

a positive pin of the green lighting chip is electrically connected to the positive power connection part, and a negative pin of the green lighting chip is electrically connected to a second pin of the main control chip; and a positive pin of the red lighting chip is electrically connected to the positive power connection part, and a negative pin of the red lighting chip is electrically connected to a third pin of the main control chip.

4. The point-control lamp according to claim 3, wherein the lighting chips further comprise a white lighting chip, a negative pin of the blue lighting chip, a ninth pin of the main control chip, a tenth pin of the main control chip, and a positive pin of the white lighting chip are sequentially electrically connected; and a negative pin of the white lighting chip is electrically connected to an eleventh pin of the main control chip.

5. The point-control lamp according to claim 3, wherein the lighting chips further comprise a white lighting chip;
a negative pin of the blue lighting chip, a ninth pin of the main control chip, a tenth pin of the main control chip, and a positive pin of the white lighting chip are sequentially electrically connected; and a negative pin of the white lighting chip is electrically connected to an eleventh pin of the main control chip.

6. The point-control lamp according to claim 1, wherein the lighting chips further comprise a white lighting chip; and
a positive pin of the white lighting chip is electrically connected to the positive power connection part, and a negative pin of the white lighting chip is electrically connected to a fourth pin of the main control chip.

7. The point-control lamp according to claim 1, wherein the lighting chips comprise a blue lighting chip, a green lighting chip, and a red lighting chip; a power voltage between the positive power connection part and the negative power connection part is a second voltage;
a positive pin of the red lighting chip is electrically connected to the positive power connection part;
a negative pin of the red lighting chip, a fifth pin of the main control chip, a sixth pin of the main control chip, and a positive pin of the green lighting chip are sequentially electrically connected;
a negative pin of the green lighting chip, a seventh pin of the main control chip, an eighth pin of the main control chip, and a positive pin of the blue lighting chip are sequentially electrically connected; and
a negative pin of the blue lighting chip is electrically connected to a ninth pin of the main control chip.

8. The point-control lamp according to claim 1, wherein the lighting chips comprise a blue lighting chip, a green lighting chip, and a red lighting chip; a power voltage between the positive power connection part and the negative power connection part is a third voltage;
a positive pin of the red lighting chip is electrically connected to the positive power connection part;
a negative pin of the red lighting chip, a fifth pin of the main control chip, a sixth pin of the main control chip, and a positive pin of the green lighting chip are sequentially electrically connected;
a negative pin of the green lighting chip, a seventh pin of the main control chip, an eighth pin of the main control chip, and a positive pin of the blue lighting chip are sequentially electrically connected; and
a negative pin of the blue lighting chip is electrically connected to a ninth pin of the main control chip.

9. The point-control lamp according to claim 1, wherein the lighting chips comprise multiple blue lighting chips, multiple green lighting chips, and multiple red lighting chips; the multiple blue lighting chips are sequentially connected to form a blue lighting component; the multiple green lighting chips are sequentially connected to form a green lighting component; the multiple red lighting chips are sequentially connected to form a red lighting component; a power voltage between the positive power connection part and the negative power connection part is a third voltage;
a positive pin of the red lighting component is electrically connected to the positive power connection part;
a negative pin of the red lighting component, a fifth pin of the main control chip, a sixth pin of the main control chip, and a positive pin of the green lighting component are sequentially electrically connected;
a negative pin of the green lighting component, a seventh pin of the main control chip, an eighth pin of the main control chip, and a positive pin of the blue lighting component are sequentially electrically connected; and
a negative pin of the blue lighting component is electrically connected to a ninth pin of the main control chip.

10. A lamp string, wherein the lamp string comprises a power supply and the point-control lamp according to claim 1.

* * * * *